United States Patent
Wang

(10) Patent No.: US 7,820,346 B2
(45) Date of Patent: Oct. 26, 2010

(54) METHOD FOR COLLECTING OPTICAL PROXIMITY CORRECTION PARAMETER

(75) Inventor: Jinheng Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/573,753

(22) Filed: Oct. 5, 2009

(65) Prior Publication Data
US 2010/0129740 A1 May 27, 2010

(30) Foreign Application Priority Data
Nov. 27, 2008 (CN) .................. 2008 1 0203537

(51) Int. Cl.
*G03F 9/00* (2006.01)
*G06K 9/00* (2006.01)
*G06F 17/50* (2006.01)

(52) U.S. Cl. .............. 430/30; 430/5; 382/145; 382/149; 716/11; 716/19; 716/21

(58) Field of Classification Search .......... 430/5, 430/30; 382/145, 149; 716/11, 19, 21
See application file for complete search history.

(56) References Cited

U.S. PATENT DOCUMENTS 6,280,887 B1 *   8/2001   Lu ..................... 430/5
6,303,253 B1 *  10/2001   Lu ..................... 430/5
6,329,107 B1 *  12/2001   Lu ..................... 430/5
6,523,162 B1 *   2/2003   Agrawal et al. ........... 716/19
6,767,679 B2 *   7/2004   Hsieh et al. ............. 430/30

\* cited by examiner

*Primary Examiner*—Christopher G Young
(74) *Attorney, Agent, or Firm*—Squire, Sanders & Dempsey, L.L.P.

(57) ABSTRACT

This invention relates to a method for collecting an Optical Proximity Correction parameter, which includes: performing an Optical Proximity Correction for a test line containing a non-right turning-angle to generate a to-be-exposed pattern having an assistant line; obtaining, by way of simulation or actual exposure, a formed line generated from the to-be-exposed pattern being exposed; and comparing the formed line with the test line to determine a difference there between so as to determine whether there is a redundant part and/or a missing part in the assistant line at location of the turning-angle of the test line. Being compared with the prior art, this invention sets the non-right turning-angle in the to-be-exposed test line. By comparing the formed line (which is generated by simulation or actual exposure) of the above test line with the test line itself, the redundant part and/or the missing part of the assistant line, as well as proximity data such as the position of the redundant part and/or the missing part and the like, can be obtained. Then, these proximity data can be used to correct and perfect the OPC model having a line containing a non-right turning-angle.

10 Claims, 6 Drawing Sheets

METHOD FOR COLLECTING OPTICAL PROXIMITY CORRECTION PARAMETER

CROSS-REFERENCE TO RELATED APPLICATIONS

This application claims priority to Chinese Patent Application No. 200810203537.2 filed Nov. 27, 2008, which is incorporated herein by reference as if reproduced in its entirety.

FIELD OF THE INVENTION

The present invention relates to the field of semiconductor device manufacturing, and in particular to a method for collecting an Optical Proximity Correction parameter.

BACKGROUND OF THE INVENTION

Along with the rapid development of semiconductor manufacturing technologies, in order to gain faster calculation speed, larger data storage amount and more functions for a semiconductor device, semiconductor chips are improved to obtain higher integrity. However, the higher the integrity of the semiconductor chip, the smaller the Critical Dimension (CD) of the semiconductor device. In the 90 nm technique condition, the CD employed in a very large scale integrated circuit has reached the range from tens to hundreds of nanometers.

According to an Optical Proximity Correction (OPC) method, patterns on a photographic mask are corrected in advance, for example, a method which uses the Sub-Resolution Assist Feature (SRAF) as an assistant pattern on the photographic mask. The technical solution disclosed in Chinese Patent No. 95102281.4 is taken as an example. As shown in FIG. 1, in the circuit layout 1 of the Optical Proximity Correction software, a to-be-exposed assistant pattern 15 is added between adjacent to-be-exposed circuit patterns 10, where the to-be-exposed assistant pattern 15 is parallel to the to-be-exposed circuit pattern 10. The to-be-exposed assistant pattern 15 is a Sub-Resolution Assist Feature, for decreasing the intensity of light traveling between the adjacent to-be-exposed circuit patterns 10. Then, the to-be-exposed circuit pattern 10 and the to-be-exposed assistant pattern 15 having been designed in the OPC software are input into photographic mask manufacturing equipment. According to the sizes and positions of the input to-be-exposed circuit pattern 10 and to-be-exposed assistant pattern 15, the equipment can automatically generate a circuit pattern and an assistant pattern on the photographic mask using chrome layer or phase shifter. Here, the dimension of the to-be-exposed assistant pattern 15 is determined by the to-be-exposed circuit pattern 10, and generally, the width thereof ranges from 20 nm to 45 nm and the length from 80 nm to 120 nm. The width of the to-be-exposed assistant pattern 15 ranges from ⅖ to ⅘ of that of the to-be-exposed circuit pattern 10, and the length thereof is about 2 to 3 times of the difference resulted from the interval between adjacent to-be-exposed circuit patterns 10 minus the width of the to-be-exposed assistant pattern 15. When the assistant pattern on the photographic mask is reflected to the semiconductor substrate, because the dimension of the assistant pattern on the photographic mask is smaller than the resolution of the lithography equipment, a photo-resist film pattern corresponding to the assistant pattern will not be generated on the semiconductor substrate. Such a method of adding the Sub-Resolution Assist Feature is very suitable for correcting patterns relatively far away from each other to make them look denser, and increasing the Depth Of Field (DOF) of the exposed patterns which are far away from each other to improve the quality of the photos. Meanwhile, a dense pattern arrangement can greatly increase the freedom of process.

In the prior art, pattern lines are all straight lines or contain only right turning-angles. However, along with the continuously decreased dimension of the semiconductor device, using only the straight line or right turning-angle can not meet the requirements of pattern layout. Therefore, non-right turnings begin to be used in the pattern lines. Thus, when designing an OPC assistant pattern, it is required to collect proximity data of lines having various turning-angles to meet the requirements of designing the OPC assistant pattern.

SUMMARY OF THE INVENTION

The present invention seeks to solve the technical problem of collecting proximity data of lines having various turning-angles when designing an OPC assistant pattern.

In order to solve the above technical problem, according to an aspect of the present invention, a method for collecting an Optical Proximity Correction parameter is provided, which includes: performing an Optical Proximity Correction for a test line containing a non-right turning-angle to generate a to-be-exposed pattern having an assistant line; obtaining, by way of simulation or actual exposure, a formed line generated from the to-be-exposed pattern being exposed; and comparing the formed line with the test line to determine a difference there between so as to determine whether there is a redundant part and/or a missing part in the assistant line at location of the turning-angle of the test line.

Optionally, the method further includes obtaining a corresponding length of the redundant part and/or the missing part of the assistant line.

Optionally, the method further includes obtaining a corresponding position of the redundant part and/or the missing part of the assistant line.

Optionally, the non-right turning-angle includes 15 degrees, 30 degrees, 45 degrees, 60 degrees, 75 degrees, 105 degrees, 120 degrees, 135 degrees, 150 degrees and/or 165 degrees; and the determining whether there is a redundant part and/or a missing part in the assistant line at location of the turning-angle of the test line includes determining whether there is a redundant part and/or a missing part at the location of the turning-angle of a single degree or the locations of the turning-angles of various degrees.

Optionally, a width of the test line is 100 nanometers, 65 nanometers, 45 nanometers, 32 nanometers, or 22 nanometers.

Optionally, the non-right turning-angle is an angle in the test line which test line is continuous.

Optionally, there are at least one group of test lines, each group includes at least one test line, and a width of the test line of each group is identical to each other and a corresponding interval between the test lines is different from each other.

Optionally, a ratio of the width to the interval ranges from 1:1 to 1:10.

Optionally, there are at least one group of test lines, each group includes at least one test line, and a ratio of a width of the test line of each group to a corresponding interval between the test lines is identical to each other.

Optionally, the ratio to the interval is 1:1.

Being compared with the prior art, the present invention sets the non-right turning-angle in the to-be-exposed test line. By comparing the formed line (which is generated by simulation or actual exposure) of the above test line with the test line itself, the redundant part and/or the missing part of the assistant line at the location of the turning-angle of the test line, as well as proximity data such as the position of the redundant part and/or the missing part and the like, can be obtained. Then, these proximity data can be used to correct and perfect the OPC model having a line containing a non-right turning-angle.

DETAILED DESCRIPTION OF THE EMBODIMENTS

Figure 1:
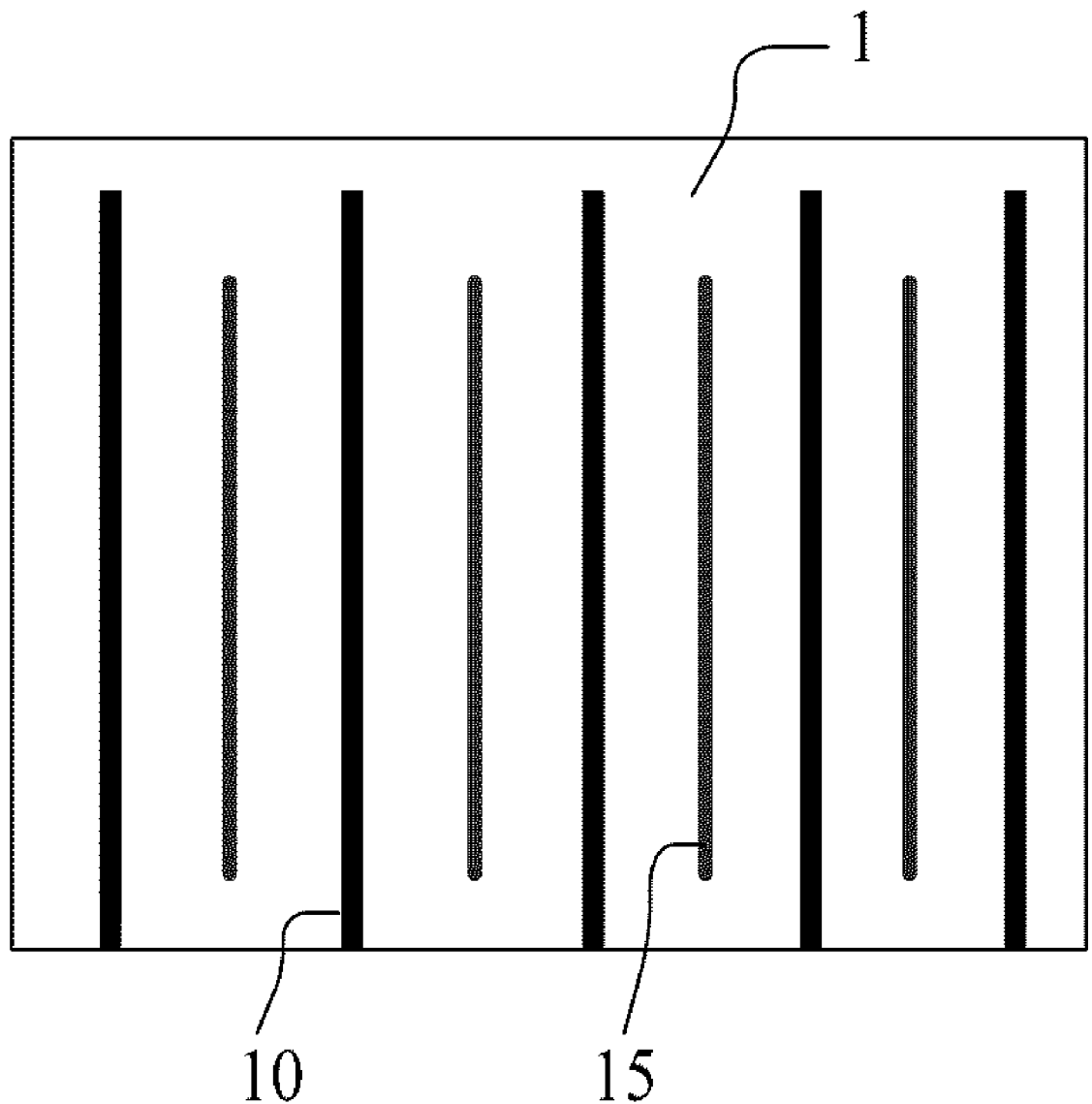
FIG. 1 is a diagram illustrating an Optical Proximity Correction of the prior art.
Figure 2:
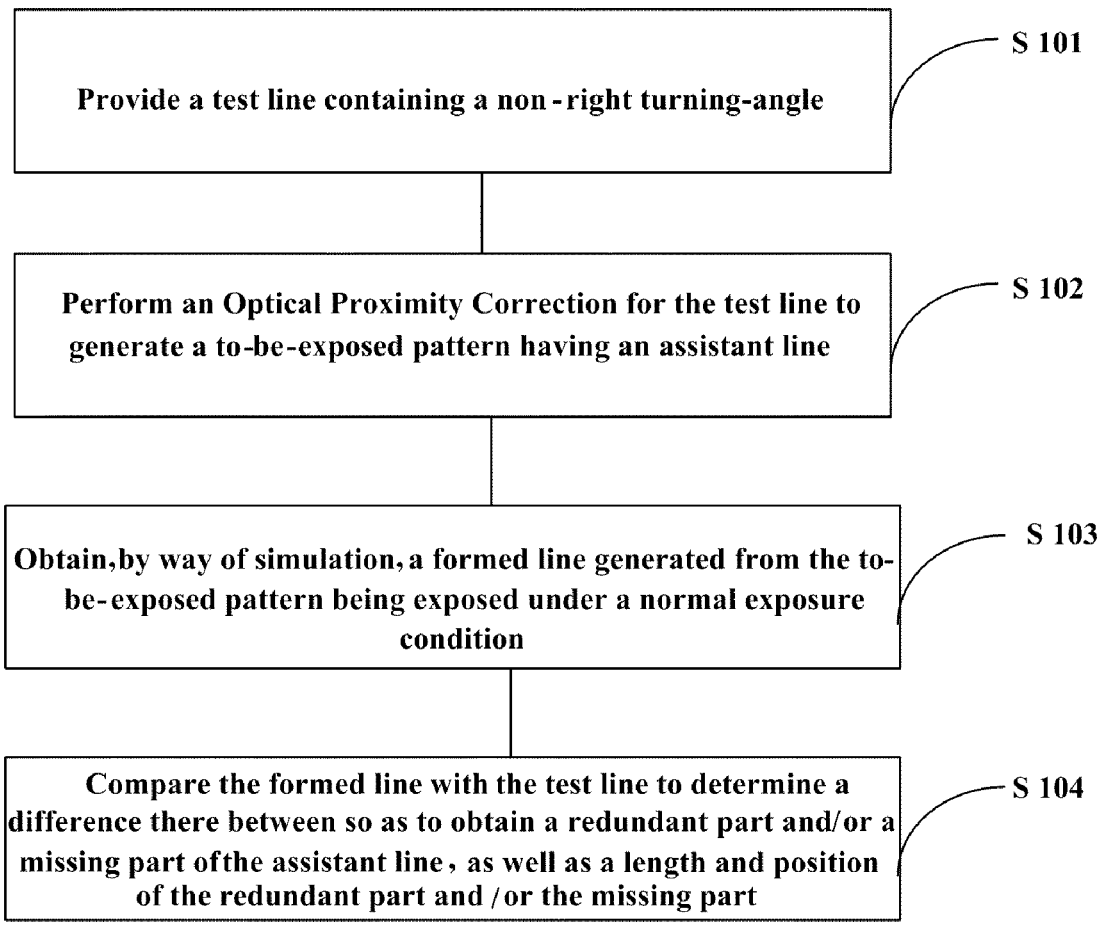
FIG. 2 is a flow chart illustrating a method for collecting an Optical Proximity Correction parameter according to an embodiment of the present invention.

Along with the continuously decreased dimension of the semiconductor device, using only the straight line or right turning-angle can not meet the requirements of pattern layout. Therefore, non-right turnings begin to be used in the pattern lines. In order to solve the technical problem of collecting proximity data of lines having various turning-angles when designing an OPC assistant pattern so as to correct the OPC model, as illustrated in FIG. 2, a method for collecting an Optical Proximity Correction parameter is provided according to a specific embodiment of the present invention, which includes the following steps:

S101: Provide a test line containing a non-right turning-angle;

S102: Perform an Optical Proximity Correction for the test line to generate a to-be-exposed pattern having an assistant line;

S103: Obtain, by way of simulation, a formed line generated from the to-be-exposed pattern being exposed under a normal exposure condition;

S104: Compare the formed line with the test line to determine a difference there between so as to obtain a redundant part and/or a missing part of the assistant line at the location of the turning-angle of the test line, as well as a length and position of the redundant part and/or the missing part.

Figure 3:
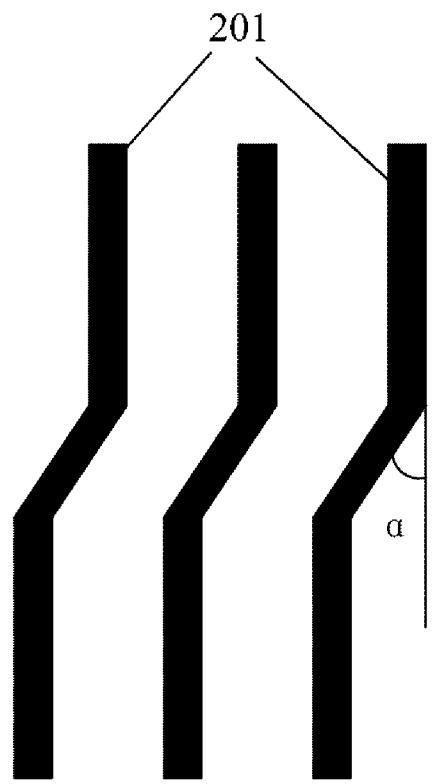
FIG. 3 is a diagram illustrating test lines according to an embodiment of the present invention.

As illustrated in FIG. 3, step S101 is executed to provide a test line 201 containing the non-right turning-angle α. The width of the test line 201 is designed and determined according to the dimension of the semiconductor device. For example, in the semiconductor device manufacturing technique with a line width of 65 nm, the width of the test line 201 may be 65 nm. While, for a 32 nm technology node, the width of the test line 201 may be 32 nm. Therefore, according to available technology nodes, the width of the test line 201 may be 100 nanometers, 65 nanometers, 45 nanometers, 32 nanometers, or 22 nanometers. Those skilled in the art can understand that the above-mentioned width of the test line 201 is only exemplary and shall not be regarded as a limit.

Figure 4:
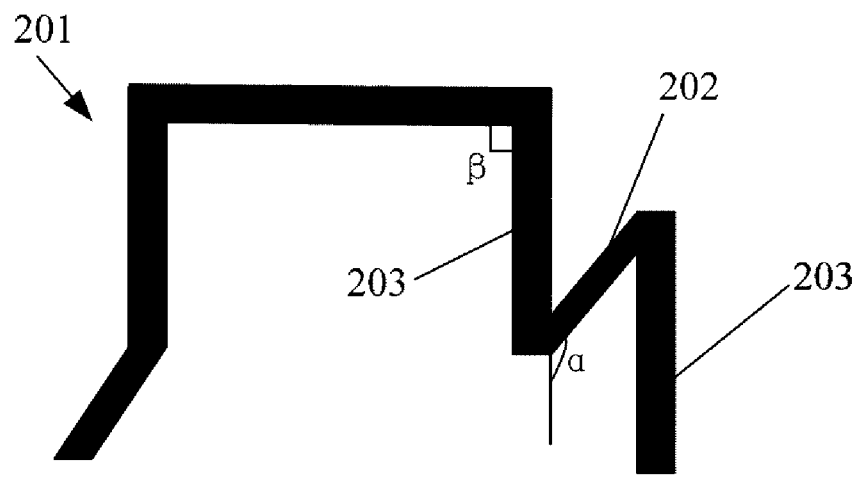
FIG. 4 is a diagram illustrating test lines according to another embodiment of the present invention.

The non-right turning-angle α of the test line 201 may occur in the middle of the line as shown in FIG. 3, and may alternatively occur at the end or another position of the line as shown in FIG. 4. In other words, setting the non-right turning-angle α at various positions can achieve the object of the present invention in the same way.

Besides, as shown in FIG. 4, in addition to the non-right turning-angle α, a right turning-angle β may also exist in the test line 201. The amount of the non-right turning-angle α and the right turning-angle β may be determined according to the requirements of collecting a proximity parameter. The relative position of the non-right turning-angle α to that of the right turning-angle β can also be adjusted according to the requirements. For example, one or more right turning-angles β can be arranged between two non-right turning-angles a in a test line, and alternatively, one or more non-right turning-angles α can be arranged between two right turning-angles β in the test line.

In order to obtain optical proximity data of various angles, the non-right turning-angle α may be designed as any angle. However, the more the available angles of the non-right turning-angle α, the larger the amount of the data required to be collected. Moreover, in the IC layout design, the direction of a line is not arbitrary. In the prior art, in order to facilitate the manufacturing of the mask and the design, the direction of the line is generally at a right angle. In the case of a smaller critical dimension, the turning-angle of the line is designed much less arbitrarily. Generally speaking, a design with a turning-angle interval of 15 degrees can already meet the requirements of designing the IC layout. In other words, the non-right turning-angle α can be 15 degrees, 30 degrees, 45 degrees, 60 degrees, 75 degrees, 105 degrees, 120 degrees, 135 degrees, 150 degrees and 165 degrees. Those skilled in the art can understand that the above-mentioned angle of the non-right turning-angle α is only exemplary and shall not be regarded as a limit.

Figure 5:
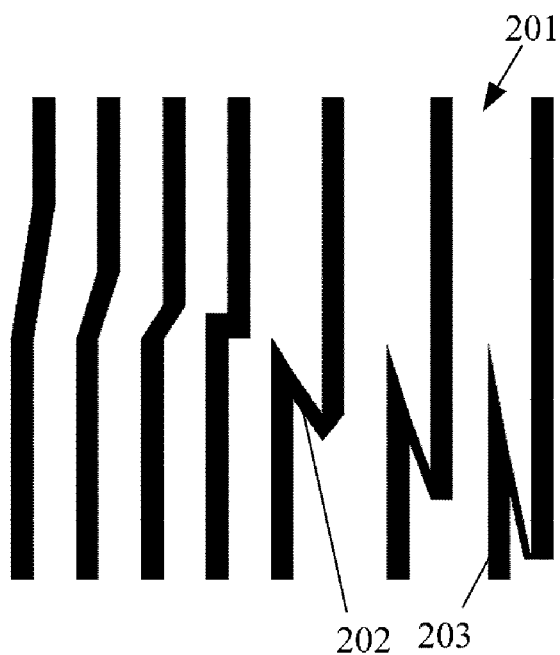
FIG. 5 is a diagram illustrating test lines according to still another embodiment of the present invention.

As shown in FIG. 5, depending on various non-right turning-angles α, the width of the broken line segment 202 of the test line 201 may be different. The width of the broken line segment 202 may also differ from the width of another straight line segment 203 of the test line 201. The width of the broken line segment 202 depends on the degree of the non-right turning-angle α and the distance between the two straight line segments 203 sandwiching the broken line segment 202. If the width of the broken line segment 202 is too small, the critical dimension of the subsequent lithography technique may decrease, thus increasing the manufacturing cost. If the width of the broken line segment 202 is too large, the distance between the two straight line segments 203 may be restricted, thus increasing the difficulty of designing the IC layout.

Figure 6:
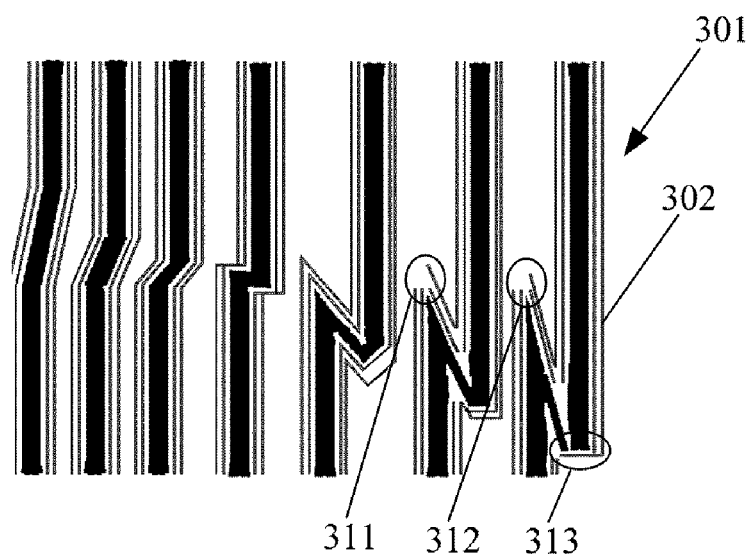
FIG. 6 is a diagram illustrating to-be-exposed patterns generated by performing an Optical Proximity Correction on the basis of FIG. 5.

When shape parameters such as the width of the line and the degree of the turning-angle are determined, step S102 can be executed to perform an Optical Proximity Correction for the test line 201 to form a to-be-exposed pattern 301 having an assistant line 302 as illustrated in FIG. 6.

As is well known, when moving the mask pattern onto the substrate, an optical proximity effect (OPE) often occurs. For example, right-angle corner rounded, line end shortened, and line width increase/decrease and the like are all frequently occurred defects resulted from the mask pattern being moved onto the substrate which are caused by the optical proximity effect. Thus, before being written into a photographic mask to form a mask pattern, a layout pattern is required to be corrected. In the embodiment, the object of correcting the layout pattern is to compensate the influence caused by the optical proximity effect. Typically, methods for correcting a linear pattern include an optical proximity effect correction method based on rules, an optical proximity effect correction method based on models, an optical proximity effect correction method based on pixels, etc. The optical proximity correction methods are not described in detail herein, in that these methods are already well known for those skilled in the art.

The OPC step can be done in dedicated OPC software, i.e., the shape data of the test line 201 is input into the OPC software, and by calculation according to an existing model, the to-be-exposed pattern 301 containing the assistant line 302 is output.

Figure 7:
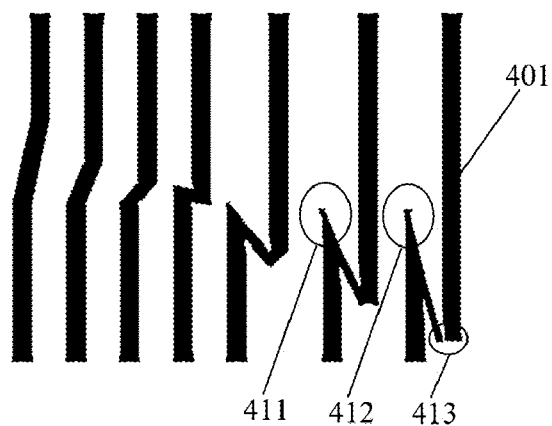
FIG. 7 is a diagram illustrating formed lines generated by performing simulated exposure for the to-be-exposed patterns shown in FIG. 6.

Then step S103 is executed, in which the formed line 401 generated from the to-be-exposed pattern 301 being exposed under a normal exposure condition is obtained by way of simulation, as shown in FIG. 7.

By way of simulation, the shape of the to-be-exposed pattern 301 is input into simulation software, and the shape of the formed line 401 generated from exposure under the normal exposure condition is calculated out using an existing model.

In the above embodiment, the formed line 401 is generated by way of simulation. However, those skilled in the art can understand that, the shape of the formed line 401 can also be obtained on the substrate by actual exposure processing under the normal exposure condition. In other words, by way of either simulation or actual exposure, the required shape of the formed line 401 can both be obtained, thus achieving the object of the present invention.

Then step S104 is executed, by comparing the formed line 401 with the test line 201, the difference there between is determined, so as to obtain a redundant part and/or a missing part of the assistant line 302 presented at the location of the turning-angle of the test line 201, as well as a length and position of the redundant part and/or the missing part. In the present invention, the redundant part refers to a redundant line of the assistant line 302 presented at the location of the turning-angle of the test line 201, and the missing part refers to a line of the assistant line 302 which should be arranged but have not been arranged at the location of the turning-angle of the test line 201.

For example, the test line 201 as shown in FIG. 5 is Optical Proximity Corrected to generate the to-be-exposed pattern 301 containing the assistant line 302 as shown in FIG. 6, and finally, the formed line 401 as shown in FIG. 7 is generated by way of simulation or actual exposure.

By comparison through FIG. 5, FIG. 6 to FIG. 7, it can be found the following: in FIG. 6, a redundant part 311 of the assistant line 302 is presented at the location of the turning-angle of the test line 201. The redundant part 311 does not gain a clear profile at the bending 411 of the formed line 401 which is shown in FIG. 7, but causes occurrence of a protruding point at the top of the bending 411.

Similarly, in FIG. 6, a redundant part 312 of the assistant line 302 is presented at the location of the turning-angle of the test line 201. The redundant part 312 also does not gain a clear profile at the bending 412 of the formed line 401 which is shown in FIG. 7, and also causes occurrence of a protruding point at the top of the bending 412.

In addition, in FIG. 7, there is a break in the formed line 401 at the bending 413. This is because in FIG. 6, there is a missing part in the assistant line 302 at the bending 313, which leads to occurrence of line end shorted effect during exposure, and the exposure cannot be carried out effectively at the bending 413.

In the above embodiment, the redundant part and/or the missing part of the assistant line 302 is obtained by comparison through FIG. 5, FIG. 6 to FIG. 7. Those skilled in the art can understand that by the above comparison, the position of the redundant part and/or the missing part of the assistant line 302 can also be obtained.

In addition, those skilled in the art can also understand that the three kinds of redundant/missing parts described above are only examples of the redundant/missing part that may occur during the OPC process. Practically, another kind of redundant/missing part may also occur at another position. Therefore, the collected Optical Proximity Correction parameters include various kinds of redundant/missing parts and/or the positions thereof, which are not limited to the above three kinds.

When designing the test line 201, not only the test line 201 containing multiple different angles can be designed within the same pattern as shown in FIG. 5, but also the test line 201 can be designed as various array patterns.

Figure 8:
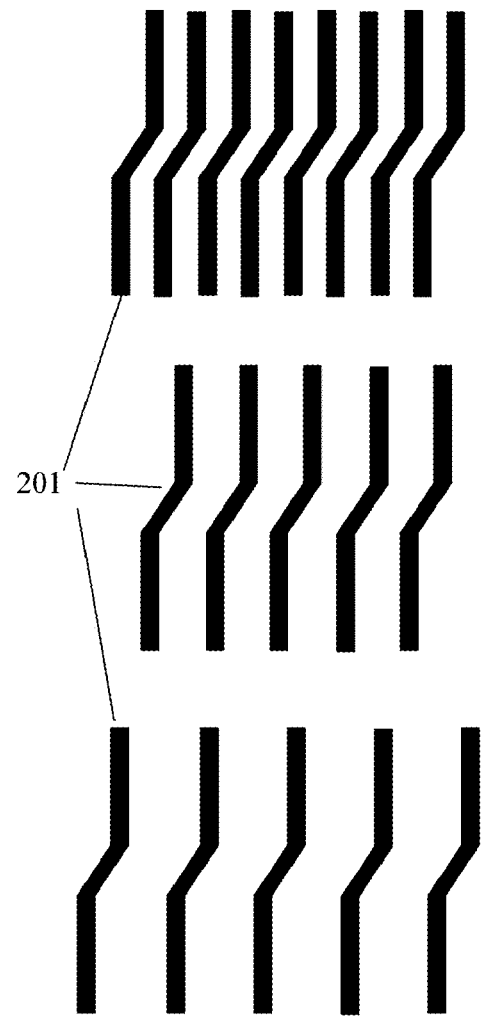
FIG. 8 is a diagram illustrating an array of the to-be-exposed patterns according to an embodiment of the present invention.

For example, as shown in FIG. 8, the test line 201 is designed as at least one group of test lines, and each group includes at least one test line 201. The width of the test line 201 of each group is identical to each other and the corresponding interval between the test lines 201 is different from each other. The ratio of the width of the test line 201 to the interval between the test lines 201 may range from 1:1 to 1:10. By combining the test lines 201 in this way, a one-dimension array of the test line 201 having an identical width of line but different intervals can be formed.

Figure 9:
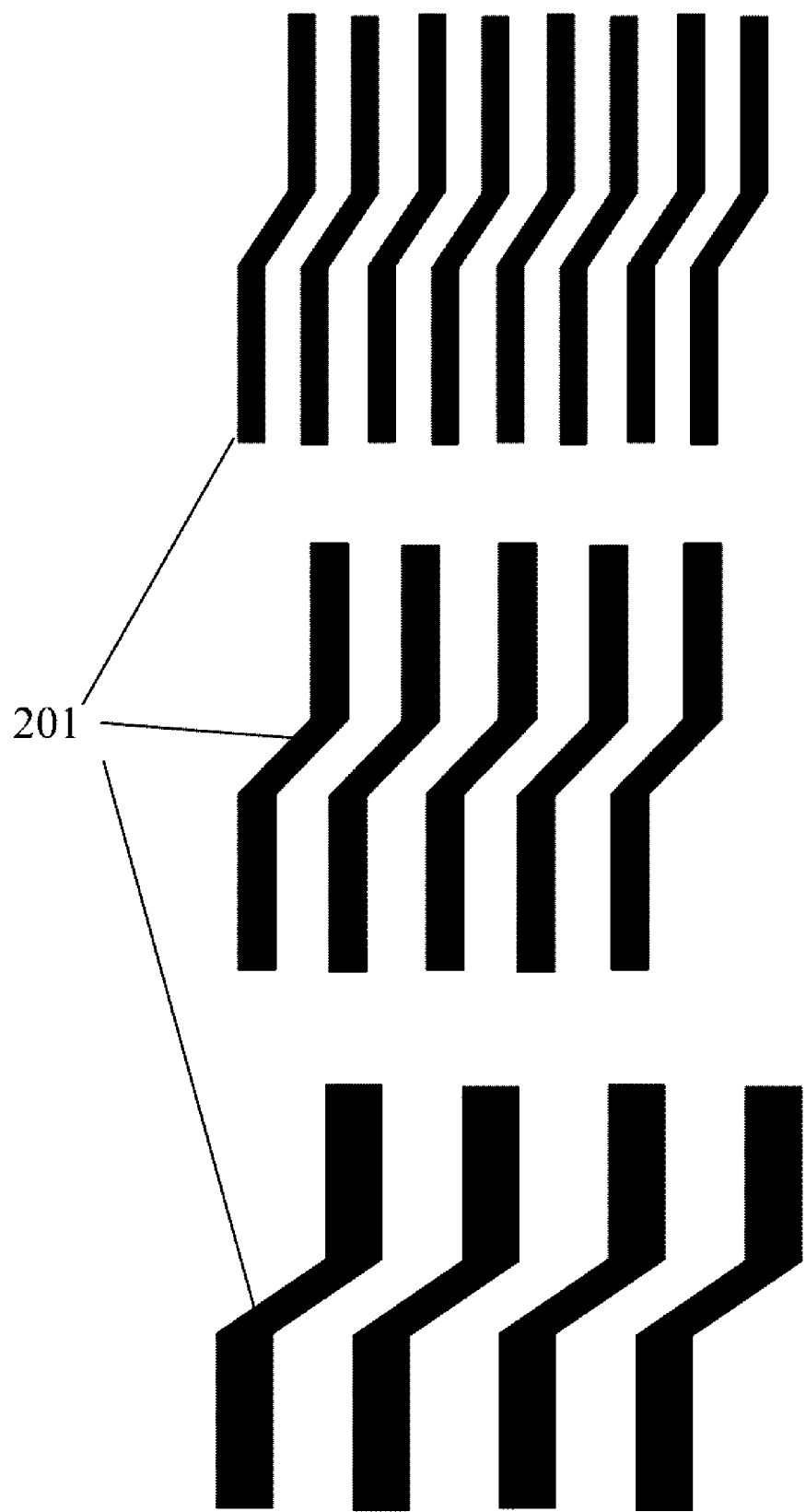
FIG. 9 is a diagram illustrating an array of the to-be-exposed patterns according to another embodiment of the present invention.

Alternatively, as shown in FIG. 9, the test line 201 is still designed as at least one group of test lines, and each group includes at least one test line 201. Both the width of the test line 201 of each group and the corresponding interval between the test lines 201 are different from each other, but the ratio of the width of the test line 201 of each group to the corresponding interval between the test lines 201 is identical to each other. The ratio of the width of the test line 201 to the interval between the test lines 201 may be 1:1. By combining the test lines 201 in this way, another one-dimension array of the test line 201 having different widths of line but an identical width-of-line/interval ratio can be formed.

By combining the two types of one-dimension arrays as shown in FIG. 8 and FIG. 9, a two-dimension matrix of the test line 201 having different widths of line and different width-of-line/interval ratios can be formed. By additionally introducing various turning-angles into the test line 201 as described above, a three-dimension matrix of the test line 201 having different widths of line, different width-of-line/interval ratios and different turning-angles can be formed. Using this type of three-dimension matrix, various kinds of Optical Proximity Correction parameters of various turning-angles at various line widths and various width-of-line/interval ratios can be collected, which may be used to revise the OPC model, thus to improve the OPC and the lithographic effects.

Although the present invention is disclosed as described above based on preferred embodiments, they are not intended to limit the claims. Any one skilled in the art can make various variations and modifications without departing from the spirit and scope of the present invention. Therefore, the scope of the present invention shall be defined by the appended claims.

What is claimed is:

1. A method for collecting an Optical Proximity Correction parameter, comprising:

performing an Optical Proximity Correction for a test line containing a non-right turning-angle to generate a to-be-exposed pattern having an assistant line;

obtaining, by way of at least one of simulation and actual exposure, a formed line generated from the to-be-exposed pattern being exposed; and comparing the formed line with the test line to determine a difference there between so as to determine whether there is at least one of a redundant part and a missing part in the assistant line at location of the turning-angle of the test line.

2. The method for collecting an Optical Proximity Correction parameter according to claim 1, further comprising: obtaining a corresponding length of at least one of the redundant part and the missing part of the assistant line.

3. The method for collecting an Optical Proximity Correction parameter according to claim 1, further comprising: obtaining a corresponding position of at least one of the redundant part and the missing part of the assistant line.

4. The method for collecting an Optical Proximity Correction parameter according to claim 1, wherein the non-right turning-angle comprises at least one of 15 degrees, 30 degrees, 45 degrees, 60 degrees, 75 degrees, 105 degrees, 120 degrees, 135 degrees, 150 degrees and 165 degrees; and the determining whether there is at least one of a redundant part and a missing part in the assistant line at location of the turning-angle of the test line comprises determining whether there is at least one of a redundant part and a missing part at a location of at least one of following: the location of the turning-angle of a single degree and the locations of the turning-angles of various degrees.

5. The method for collecting an Optical Proximity Correction parameter according to claim 1, wherein a width of the test line comprises at least one of 100 nanometers, 65 nanometers, 45 nanometers, 32 nanometers, and 22 nanometers.

6. The method for collecting an Optical Proximity Correction parameter according to claim 1, wherein the non-right turning-angle is an angle in the test line which test line is continuous.

7. The method for collecting an Optical Proximity Correction parameter according to claim 1, wherein there are at least one group of test lines, each group comprises at least one test line, and a width of the test line of each group is identical to each other and a corresponding interval between the test lines is different from each other.

8. The method for collecting an Optical Proximity Correction parameter according to claim 7, wherein a ratio of the width to the interval ranges from 1:1 to 1:10.

9. The method for collecting an Optical Proximity Correction parameter according to claim 1, wherein there are at least one group of test lines, each group comprises at least one test line, and a ratio of a width of the test line of each group to a corresponding interval between the test lines is identical to each other.

10. The method for collecting an Optical Proximity Correction parameter according to claim 9, wherein the ratio to the interval is 1:1.

* * * * *